United States Patent
Mori et al.

(10) Patent No.: US 8,354,693 B2
(45) Date of Patent: Jan. 15, 2013

(54) SOLID STATE IMAGING DEVICE AND METHOD FOR FABRICATING THE SAME

(75) Inventors: Mitsuyoshi Mori, Kyoto (JP); Toru Okino, Toyama (JP); Daisuke Ueda, Osaka (JP); Toshinobu Matsuno, Kyoto (JP)

(73) Assignee: Panasonic Corporation, Osaka (JP)

( * ) Notice: Subject to any disclaimer, the term of this patent is extended or adjusted under 35 U.S.C. 154(b) by 42 days.

(21) Appl. No.: 12/035,340

(22) Filed: Feb. 21, 2008

(65) Prior Publication Data
US 2008/0303058 A1    Dec. 11, 2008

(30) Foreign Application Priority Data
Jun. 7, 2007    (JP) .................. 2007-151954

(51) Int. Cl.
*H01L 31/0336* (2006.01)
(52) U.S. Cl. ......... 257/185; 257/E21.352; 257/E31.005; 438/73
(58) Field of Classification Search ............ 257/13, 257/22, 84, 94, 103, 184, 431, 432
See application file for complete search history.

(56) References Cited

U.S. PATENT DOCUMENTS

| | | | |
|---|---|---|---|
| 4,445,130 A * | 4/1984 | Poulain et al. ............ 257/187 |
| 5,144,398 A * | 9/1992 | Morishita ............... 257/51 |
| 5,159,424 A * | 10/1992 | Morishita ............... 257/197 |
| 6,075,253 A | 6/2000 | Sugiyama et al. |
| 2002/0014643 A1 | 2/2002 | Kubo et al. |
| 2003/0020104 A1 * | 1/2003 | Talin et al. ............ 257/295 |
| 2004/0000681 A1 * | 1/2004 | Shinohara et al. ......... 257/290 |
| 2005/0280046 A1 * | 12/2005 | Shin ................... 257/226 |
| 2006/0267013 A1 | 11/2006 | Adkisson et al. |
| 2007/0087463 A1 | 4/2007 | Adkisson et al. |

FOREIGN PATENT DOCUMENTS

| JP | 58-012481 A | | 1/1983 |
|---|---|---|---|
| JP | 02-028373 A | | 1/1990 |
| JP | 02028373 A | * | 1/1990 |
| JP | 09-172155 A | | 6/1997 |
| JP | 09-213923 | | 8/1997 |
| JP | 09-213923 A | | 8/1997 |
| JP | 2002-246581 A | | 8/2002 |
| JP | 2002-329858 A | | 11/2002 |

\* cited by examiner

*Primary Examiner* — David Vu
*Assistant Examiner* — Jonathan Han
(74) *Attorney, Agent, or Firm* — McDermott Will & Emery LLP

(57) ABSTRACT

A solid state imaging device includes a pixel having a photoelectric conversion element formed on a semiconductor substrate. The photoelectric conversion element includes: a first semiconductor layer of a first conductivity type; a second semiconductor layer of a second conductivity type formed on the first semiconductor layer and forming a junction therebetween; a third semiconductor layer formed on the second semiconductor layer and having a smaller band gap energy than the second semiconductor layer, the third semiconductor layer being made of a single-crystal semiconductor and containing an impurity; and a fourth semiconductor layer of the first conductivity type covering a side surface and an upper surface of the third semiconductor layer. Provision of the fourth semiconductor layer can reduce a current flowing in dark conditions.

18 Claims, 10 Drawing Sheets

SOLID STATE IMAGING DEVICE AND METHOD FOR FABRICATING THE SAME

BACKGROUND OF THE INVENTION (a) Fields of the Invention

The present invention relates to solid state imaging devices in which an imaging area with a plurality of pixels is provided on a semiconductor substrate, and to their fabrication methods.

(b) Description of Related Art

Solid state imaging devices are image sensors in which a signal received from a light receiving unit, such as a photodiode, provided in each pixel is output as an image signal, and they are classified according to signal transfer means into CCD (Charge Coupled Device)-type devices and MOS (Metal Oxide Semiconductor)-type devices.

Among them, the MOS-type solid state imaging device operates so that signals stored in a photodiode constituting a corresponding pixel are amplified by an amplifier circuit including a MOS transistor and the amplified signals are then output through interconnects such as output signal lines and horizontal signal lines to the outside of the device. The MOS-type solid state imaging device has the advantage that not only it can operate at a low voltage and read charges at a high speed but also an imaging area and a peripheral circuit can be mounted on a single chip. From these characteristics, the MOS-type solid state imaging device attracts much attention as an imaging element used in portable equipment such as a digital camera and a cellular telephone. In recent years, the MOS-type solid state imaging device has been required particularly to decrease cell size and enhance the sensitivity to incident light having a wavelength up to near-infrared area.

In a general MOS-type solid state imaging device, a single substrate is provided with: an imaging area made by arranging a plurality of pixels with respective photodiodes in rows and columns; a vertical shift register for pixel selection; a horizontal shift register for signal output; and a timing generator circuit for supplying pulses necessary for the vertical and horizontal shift registers.

In the imaging area, the photodiodes provided in the upper portion of the silicon substrate are each composed of an n-type region of a first conductivity type and a p-type region of a second conductivity type surrounding the n-type region. The upper portion of the n-type region is formed with a $p^+$-type region, which reduces the influence of charges generated in the surface of the silicon substrate in dark conditions and thus charges generated in the photodiode are fully transferred to a floating diffusion.

In general, the amount of charges generated in the photodiode depends on the amount of absorbed incident light. In the case of a silicon substrate, light with a wavelength of 1100 nm or lower is absorbed thereinto. For example, the amount of light incident to the substrate surface decreases with depth, and the depth at which the amount of incident light decreases to half is as follows: 0.32 μm for blue light with a wavelength of 450 nm; 0.80 μm for green light with a wavelength of 550 nm; and 3.0 μm for red light with a wavelength of 700 nm. As can be seen from this, incident light with a longer wavelength is less absorbed into the substrate and thus a greater amount of the light can reach a deeper portion of the substrate. With the current state of the art, the photodiode area is formed by impurity implantation and diffusion. Thus, if the photodiode is expanded to an area capable of fully absorbing light with a long wavelength, impurities diffuse also in the horizontal direction. Therefore, in the increasingly-miniaturized solid state imaging device, it is difficult to expand the photodiode to a deeper portion of the substrate. Moreover, the $p^+$-type layer is formed in the vicinity of the substrate surface, which causes the problem that particularly charges generated by light with a short wavelength cannot be stored in the photodiode.

Approaches for solving the above-mentioned problems include a conventional technique as disclosed in Japanese Unexamined Patent Publication No. H9-213923. FIG. 10 is a sectional view showing a photodiode unit of a conventional solid state imaging device.

Referring to FIG. 10, the photodiode includes not only a p-type region 121 and an n-type region (a charge storage region) 112 but also an n-type single-crystal semiconductor layer 171. The n-type single-crystal semiconductor layer 171 is made of germanium (Ge), silicon germanium (SiGe), gallium arsenide (GaAs), or the like having a higher absorption coefficient than silicon. With this composition, the thickness of the n-type single-crystal semiconductor layer 171 provided above the silicon substrate 111 can be smaller than that of the case where the n-type single-crystal semiconductor layer 171 is made of silicon. Alternatively, the n-type single-crystal semiconductor layer 171 is expanded in the upward direction of the silicon substrate to increase its thickness, whereby the sensitivity of the photodiode can be enhanced. Note that in FIG. 10, the reference numeral 122 denotes a p-type region, the reference numeral 113 denotes an n-type region, the reference numeral 125 denotes a p-type region, the reference numeral 141 denotes a transfer electrode, the reference numerals 132 and 135 denote insulating films, the reference numeral 134 denotes a spacer, the reference numeral 151 denotes a light shielding film, and the reference numeral 152 denotes an opening of the light shielding film.

SUMMARY OF THE INVENTION

In the conventional solid state imaging device shown in FIG. 10, however, crystal defects are present in the surface portion of the n-type single-crystal semiconductor layer 171 provided on the n-type region 112. Because of these crystal defects, a large amount of noise current (dark current) is generated even in the state in which no light is irradiated. Such noise current is also generated during light irradiation. Particularly at a low illuminance, noise charges cancel signal charges generated by photoelectric conversion, so that the sensitivity of the solid state imaging device cannot be improved. Moreover, it is difficult for the conventional device structure to read all charges stored in the n-type region 112, and thus image lag may occur.

Furthermore, materials with different lattice constants are grown on the silicon substrate in the form of single crystal. Therefore, as film thickness increases in order to enhance the sensitivity, cracks are more easily created in the n-type single-crystal semiconductor layer 171. As a result of this, a number of noise charges are generated from the cracked portion even in the state in which no light enters therein, which causes the problem that the sensitivity cannot be improved.

In view of the conventional problems mentioned above, an object of the present invention is to provide a solid state imaging device having reduced influence of noise charges, high sensitivity, and no image lag, and to provide a method for fabricating such a device.

To attain the above object, a solid state imaging device according to the present invention includes: a first semiconductor layer of a first conductivity type formed on a semiconductor substrate; a second semiconductor layer of a second conductivity type formed on the first semiconductor layer and forming a junction therebetween; a third semiconductor layer formed on the second semiconductor layer and having a smaller band gap energy than the second semiconductor layer, the third semiconductor layer being made of a single-crystal semiconductor and containing an impurity; and a fourth semiconductor layer of the first conductivity type covering a side surface and an upper surface of the third semiconductor layer.

In this structure, the third semiconductor layer is made of a material having a smaller band gap energy than the second semiconductor layer. Thereby, light with a longer wavelength can be absorbed as compared with the case where the third semiconductor layer is made of the same material as the second semiconductor layer (for example, silicon), so that the sensitivity to light with a long wavelength such as red light can be enhanced. Moreover, the fourth semiconductor layer of the first conductivity type covers the upper and side surfaces of the third semiconductor layer. Thereby, a depletion layer can be prevented from expanding even to the fourth semiconductor layer, so that the influence of charges generated in the vicinity of the upper surface of the photoelectric conversion element in dark conditions can be reduced.

In the case where a floating diffusion (an FD unit) is provided in the pixel and the second semiconductor layer of the second conductivity type is surrounded by a semiconductor layer of the first conductivity type, all charges generated in the second and third semiconductor layers can be transferred to the FD unit, which prevents the occurrence of image lag.

Preferably, the first and second semiconductor layers are made of, for example, silicon, respectively, and preferably, the third semiconductor layer is made of, for example, $Si_xGe_{(1-x)}$, when x meets $0 \leq x < 1$. The third semiconductor layer may contain carbon if required.

A method for fabricating a solid state imaging device according to the present invention is a fabrication method of a solid state imaging device which includes a pixel having: a photoelectric conversion element having a first semiconductor layer, a second semiconductor layer, a third semiconductor layer, and a fourth semiconductor layer formed on a semiconductor substrate; and a transfer transistor formed on the semiconductor substrate and transferring charges generated in the photoelectric conversion element. This method includes: the step (a) of forming the first semiconductor layer of a first conductivity type, the second semiconductor layer of a second conductivity type provided on the first semiconductor layer, and a fifth semiconductor layer of the first conductivity type provided adjacent to the second semiconductor layer by implanting impurity ions of first or second conductivity type into the semiconductor substrate; the step (b) of forming a gate electrode above the fifth semiconductor layer with a gate insulating film interposed therebetween; the step (c) of forming a first insulating film covering an upper surface and a side surface of the gate electrode and having an opening formed above the second semiconductor layer; and the step (d) of forming the photoelectric conversion element by epitaxially growing, on the second semiconductor layer, the third semiconductor layer having a smaller band gap energy than the second semiconductor layer and then epitaxially growing the fourth semiconductor layer of the first conductivity type covering a side surface and an upper surface of the third semiconductor layer.

With this method, the fourth semiconductor layer covering the upper and side surfaces of the third semiconductor layer can be formed easily. In particular, if the upper surface of the fourth semiconductor layer is located at a level equal to or lower than the level of the upper surface of the gate electrode, the formed fourth semiconductor layer becomes resistant to being damaged by polishing and the like to be performed later.

This method further includes: the step (e) of forming, after the step (c) and before the step (d), an interlayer insulating film over the substrate, and then forming a contact penetrating the interlayer insulating film to make connection with the gate electrode; the step (f) of forming, after the step (e) and before the step (d), a second insulating film on the interlayer insulating film and the upper surface of the contact; the step (g) of removing, after the step (f) and before the step (d), portions of the interlayer insulating film and the second insulating film located on or above the second semiconductor layer; and the step (h) of forming, after the step (d), an interconnect on the interlayer insulating film, the interconnect being connected to the contact. Thereby, the thickness of the third semiconductor layer can be increased up to such an extent that the upper surface of the fourth semiconductor layer is located at a level equal to the level of the upper surface of the contact. With this, the sensitivity especially to light with a long wavelength can be enhanced significantly.

DETAILED DESCRIPTION OF THE PREFERRED EMBODIMENTS

As will be described below, a solid state imaging device according to the present invention is characterized by the structure of a photoelectric conversion unit such as a photodiode in a pixel, and applicable circuitry to the device is the circuitry of a typical MOS-type image sensor. In this specification, the term "solid state imaging device" indicates a device which includes a photoelectric conversion element provided on a semiconductor chip and which is adapted to output an image signal to the outside, and the term "imaging device" indicates imaging equipment including a solid state imaging device, such as a digital still camera, a digital video camera, a camera installed in a cellular telephone, and a monitoring camera.

First Embodiment

—Circuitry—

Figure 1:
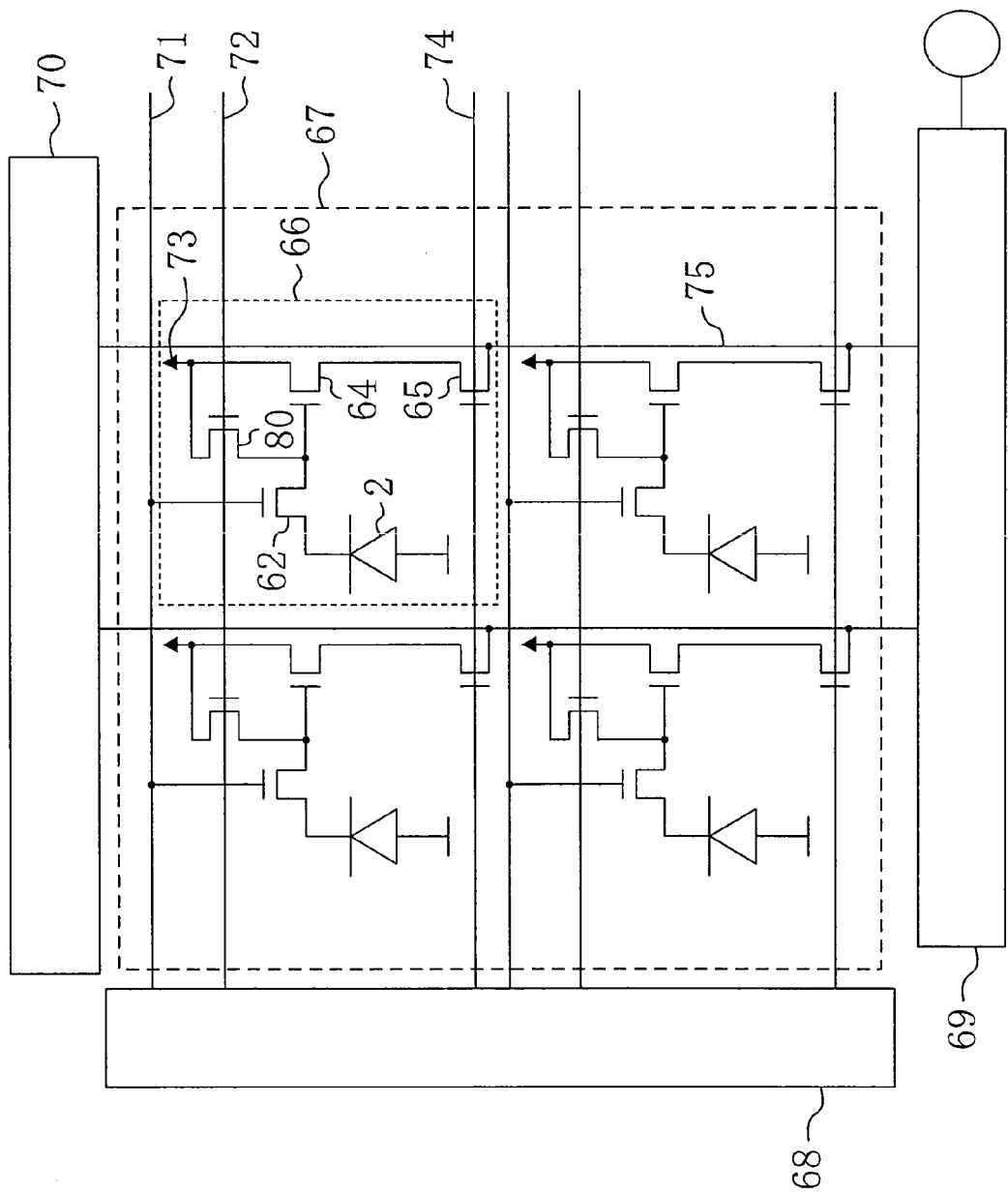
FIG. 1 is a diagram showing an example of circuitry of a MOS-type solid state imaging device according to a first embodiment of the present invention.

FIG. 1 is a diagram showing an example of circuitry of a MOS-type solid state imaging device according to a first embodiment of the present invention. Referring to FIG. 1, the solid state imaging device according to the first embodiment includes: an imaging area 67 in which a plurality of pixels 66 are arranged in rows and columns; a vertical shift register 68 for pixel selection; and a horizontal shift register 69 for transferring, through output signal lines 75, signals output from the pixels 66.

Each of the pixels 66 includes: a photoelectric conversion element 2 composed of, for example, a photodiode; a transfer transistor 62 for transferring, to a floating diffusion unit (an FD unit), charges generated in the photoelectric conversion element 2; an amplification transistor 64 for amplifying a charge signal stored in the FD unit and outputting the amplified signal to the output signal line 75; a reset transistor 80 connected at its one end to a supply voltage feed unit 73 and resetting the state of the FD unit; and a selection transistor 65 for controlling whether the signal amplified by the amplification transistor 64 is output to the output signal line 75. Gate electrodes of the transfer transistor 62, the reset transistor 80, and the selection transistor 65 are connected to output pulse lines 71, 72, and 74 extending from the vertical shift register 68, respectively. The shown pixel is an example of pixels, and circuitry in which at least one photoelectric conversion element 61 is arranged in a pixel can be applied to the solid state imaging device according to the present invention. In addition, by applying the structure of the photoelectric conversion element 61 according to the first embodiment to a MOS-type solid state imaging device, a peripheral circuit (such as the vertical shift register 68, the horizontal shift register 69, a signal output circuit, and a column amplifier) can be provided on the same chip on which the imaging area 67 is also provided, which enables reductions of device area and signal processing time and the like. Alternatively, this structure can also be applied to a CCD-type solid state imaging device.

—Structure of Pixel and Photoelectric Conversion Element—

Figure 2:
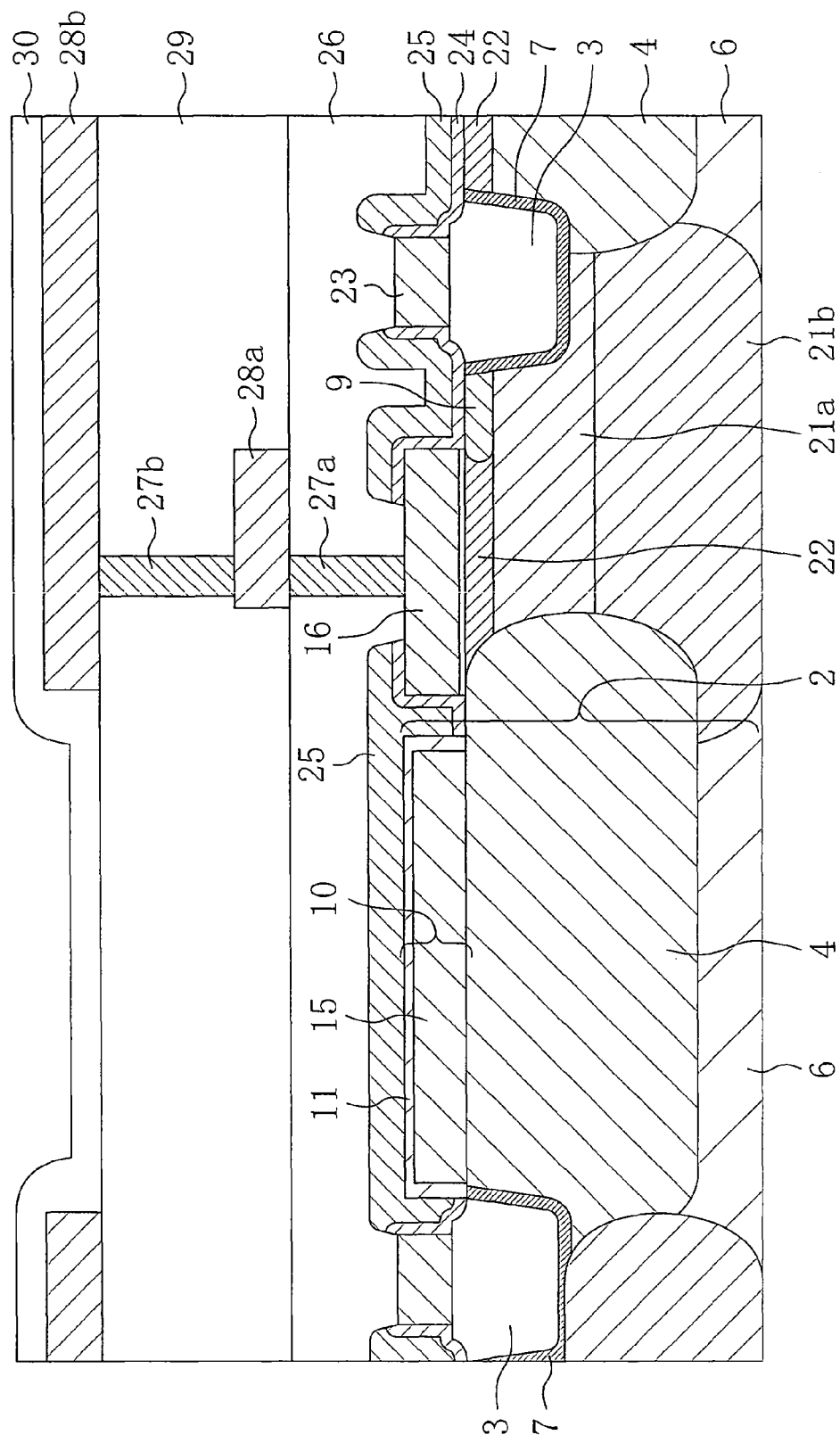
FIG. 2 is a sectional view showing a portion of a pixel of the solid state imaging device according to the first embodiment.

FIG. 2 is a sectional view showing a portion of the pixel of the solid state imaging device according to the first embodiment of the present invention. FIG. 2 illustrates a cross section taken along the line crossing the photoelectric conversion element 2, a gate electrode 16 of a transfer transistor, and an FD unit 9.

Referring to FIG. 2, in the pixel of the solid state imaging device according to the first embodiment, the photoelectric conversion element 2 is formed on a semiconductor substrate made of silicon or the like. The photoelectric conversion element 2 includes: a $p^-$-type semiconductor layer (a first semiconductor layer) 6 provided on the semiconductor substrate; an n-type semiconductor layer (a second semiconductor layer) 4 provided on the $p^-$-type semiconductor layer 6 and forming a junction therebetween; and a semiconductor epitaxial layer 10 provided on the n-type semiconductor layer 4.

The semiconductor epitaxial layer 10 is composed of: a charge storage layer (a third semiconductor layer) 15 provided on the n-type semiconductor layer 4 and made of a single-crystal semiconductor with a smaller band gap energy than the n-type semiconductor layer 4; and a $p^+$-type impurity layer (a fourth semiconductor layer) 11 of a p-type semiconductor covering the side and upper surfaces of the charge storage layer 15. In the example shown in the first embodiment, the $p^-$-type semiconductor layer 6 and the n-type semiconductor layer 4 are both made of silicon (Si), and the charge storage layer 15 and the $p^+$-type impurity layer 11 are both made of single-crystal $Si_xGe_{(1-x)}$ (when $0 \leq x<1$). However, if the charge storage layer 15 meets the condition that it has a smaller band gap energy than the n-type semiconductor layer, it may be made of $Si_yGe_zC_{(1-x-y)}$ (when $0<y<1$, $0<z<1$, and $0<(y+z)<1$). The impurity concentration of the $p^+$-type impurity layer 11 is about $1\times10^{15}$ to $1\times10^{20}$ (counts/cm$^3$), and the impurity concentration of the charge storage layer 15 is about $1\times10^{13}$ to $1\times10^{18}$ (counts/cm$^3$). The thickness of the $p^+$-type impurity layer 11 is about 5 to 100 nm. The impurity concentration of the n-type semiconductor layer 4 is about $1\times10^{13}$ to $1\times10^{18}$ (counts/cm$^3$), and the impurity concentration of the $p^-$-type semiconductor layer 6 is about $1\times10^{13}$ to $1\times10^{17}$ (counts/cm$^3$).

The side surface of the lower portion of the n-type semiconductor layer 4 is surrounded by a p-type stopper layer 21b, and the upper portion thereof adjoins an isolation region (STI) 3 and a p-type stopper layer 21a. A p-type surface layer (a fifth semiconductor layer) 22 is formed on the p-type stopper layer 21a, and on the p-type surface layer 22, a transfer transistor is provided which has an impurity diffusion layer (not shown), a gate insulating film (not shown), and the gate electrode 16. The side and bottom surfaces of the isolation region 3 are covered with a $p^+$-type sidewall layer 7 with a small thickness. On the isolation region 3, a gate interconnect 23 is provided which is made of polysilicon or the like also used for the gate electrode 16.

A silicon oxide film 24 is provided on the side surfaces of the gate electrode 16 and the gate interconnect 23, and a silicon oxide film 25 is provided on the semiconductor epitaxial layer 10 and the silicon oxide film 24. A first interlayer insulating film 26 and a second interlayer insulating film 29 are provided over the silicon oxide film 25 and the gate interconnect 23. The solid state imaging device further includes: a contact 27a connected to the gate electrode 16 and penetrating the first interlayer insulating film 26; an interconnect 28a of aluminum (Al) or the like disposed on the first interlayer insulating film 26 and connected to the contacts 27a and 27b; an interconnect 28b provided on the second interlayer insulating film 29; and a protective film 30 expanding at least from the top of the interconnect 28b to the top of the second interlayer insulating film 29.

When light enters the photoelectric conversion element 2, holes and electrons are generated therein. Then, charges (electrons) according to the amount of incident light are stored mainly in a depletion region produced by the junction between the $p^+$-type sidewall layer 7 and the n-type semiconductor layer 4 and a depletion region produced by the junction between the semiconductor epitaxial layer 10 and the n-type semiconductor layer 4. In this structure, the germanium content in the semiconductor epitaxial layer 10 can be set freely, but increasing the germanium content therein allows absorption of light with a wavelength up to about 1800 nm. Moreover, as for light with a wavelength capable of being absorbed by silicon, since silicon germanium has a higher absorption coefficient than silicon, the photoelectric conversion element 2 in the first embodiment has a very high sensitivity. In particular, the sensitivity thereof to light with a longer wavelength is greatly improved as compared with the sensitivity in the case of using silicon.

Furthermore, the photoelectric conversion element 2 according to the first embodiment is characterized in that the side and upper surfaces of the charge storage layer 15 are covered with the $p^+$-type impurity layer 11. This prevents expansion of a depletion layer to the vicinity of the surface of the charge storage layer 15, and also reduces the influence of charges generated in the surface of the charge storage layer 15 in dark conditions. Moreover, the n-type semiconductor layer 4 is surrounded by the layers made of a p-type semiconductor. Therefore, in the case of providing the FD unit 9 within the pixel, charges generated in the photoelectric conversion element 2 can be fully transferred to the FD unit 9. This prevents the occurrence of image lag in an output image.

At the interface between the isolation region 3 and the p-type stopper layer 21a and the like, noise charges resulting from thermal energy and the like are generated in a random manner. The $p^+$-type sidewall layer 7 acts as an electrical barrier against this noise charges to prevent the noise charges from being mixed with charge signals made by photoelectric conversion.

By providing the n-type charge storage layer 15, charges generated in the semiconductor epitaxial layer 10 can be stored and maintained easily.

In the solid state imaging device according to the first embodiment, charges stored in the photoelectric conversion element 2 are read using the transfer transistor (see FIG. 1) existing at the location adjacent to the photoelectric conversion element 2. In addition, the isolation region 3 is formed in order to electrically isolate the photoelectric conversion element 2 from the FD unit 9 in the adjacent pixel.

In the substrate, a photoelectric conversion region is made by forming a junction between the p-type semiconductor layer and the n-type semiconductor layer to produce a depletion region, and the position and the range of the photoelectric conversion region are limited by the performance of an ion implantation apparatus used. If the photoelectric conversion region is expanded to the deep portion of the substrate, charge mixing occurs between adjacent photoelectric conversion regions to cause color mixture. However, in the photoelectric conversion element 2 in the first embodiment, the semiconductor epitaxial layer 10 is formed by epitaxially growing silicon germanium on the n-type semiconductor layer 4, thereby expanding the photoelectric conversion region. By employing a CVD (Chemical Vapor Deposition) method, silicon germanium can be formed more easily than silicon. Thus, with the structure of the first embodiment, a high-sensitive photoelectric conversion element capable of efficiently absorbing light can be provided relatively easily. Furthermore, the semiconductor epitaxial layer 10 can be selectively grown only in a desired area if a mask is used for formation thereof. This prevents color mixture from occurring between adjacent photoelectric conversion regions.

Since the semiconductor epitaxial layer 10 is a single-crystal film made by epitaxial growth, it does not have, between its band gaps, any level resulting from crystal defects. Thus, the solid state imaging device of the first embodiment provides reduced noise charges generated in the state of no light irradiation.

The thickness of the semiconductor epitaxial layer 10 is set to be smaller than that of the adjacent gate electrode 16. In other words, the level of the upper surface of the semiconductor epitaxial layer 10 (the $p^+$-type impurity layer 11) is set to be equal to or lower than the level of the upper surface of the gate electrode 16. This makes it difficult to cause polishing-induced damages to the semiconductor epitaxial layer 10 in polishing the first interlayer insulating film 26 formed over the semiconductor epitaxial layer 10. Furthermore, in the fabrication of the device, the semiconductor epitaxial layer 10 can be grown at high speed and high temperatures. Thus, charge movement in the surface layer portion of the semiconductor epitaxial layer can be suppressed to decrease the amount of charges generated in dark conditions, and TAT (Turn Around Time) can also be cut.

In terms of light receiving sensitivity, a thicker semiconductor epitaxial layer 10 is preferable because it can provide an increased number of charges generated by light absorption. Thus, in the solid state imaging device of the first embodiment shown in FIG. 2, the upper surface of the semiconductor epitaxial layer 10 is set to have an almost equal level to the upper surface of the gate electrode 16. Note that the germanium content in the semiconductor epitaxial layer 10 is not limited to a specific value. When the germanium content increases, the light receiving efficiency thereof is improved while the difference in lattice constant between the layer and silicon becomes wider, resulting in an increase crystal defects. Therefore, the germanium content can be selected as appropriate according to design and application of the device. For example, in the case where the semiconductor epitaxial layer 10 is formed to have almost the same thickness as the gate electrode 16, the germanium content in the semiconductor epitaxial layer 10 is preferably set at 5 to 50%. Note that in this specification, the term "germanium content" indicates the proportion of germanium atoms in the semiconductor atoms constituting the layer.

When the semiconductor epitaxial layer 10 is made of silicon germanium, addition of carbon atoms (not shown) thereto can reduce the number of charges generated in dark conditions. This is because germanium atoms larger than silicon atoms can be substituted by carbon atoms to reduce stress caused in the semiconductor epitaxial layer 10 and thus to decrease a defect area inducing an increase in the number of charges in dark conditions.

In the semiconductor epitaxial layer 10, the germanium content may vary stepwise in the upward direction from the interface with the n-type semiconductor layer 4. For example, the germanium content may be changed so that it is made low in the vicinity of the interface with the n-type semiconductor layer 4 and it is raised upwardly. With this, even though the germanium amount in the whole of the semiconductor epitaxial layer 10 is large or the semiconductor epitaxial layer 10 is thick, crystal defects can be reduced. The reason for this is that by gradually increasing the lattice constant thereof while lattice constant mismatch caused around the interface between the n-type semiconductor layer 4 and the semiconductor epitaxial layer 10 is reduced, strain created by the difference in lattice constant can be gradually relaxed. Contrary to this, the germanium content may be changed so that it is made high in the vicinity of the interface with the n-type semiconductor layer 4 and it is dropped upwardly. With this, even though the concentration of the impurity for imparting conductivity is decreased, a change of germanium composition can be utilized to transfer charges from the semiconductor epitaxial layer 10 to the n-type semiconductor layer 4. As a result of this, the influence of impurity diffusion induced by thermal processing in the fabrication processes can be suppressed to decrease variations in properties of the photoelectric conversion element. Furthermore, particularly thermal processing at high temperatures can be performed to facilitate process integration. Moreover, the impurity concentration in the semiconductor epitaxial layer 10 can be lowered to reduce the amount of charges generated in the semiconductor epitaxial layer 10 in dark conditions. Note that in the first embodiment, for example, the germanium content in the semiconductor epitaxial layer 10 is stepwise increased, within the range of 30 to 100%, upwardly from the vicinity of the interface with the n-type semiconductor layer 4.

The $p^+$-type impurity layer 11 is constructed to be electrically connected to the $p^+$-type sidewall layer 7, whereby the potential thereof is stabilized. This construction eliminates the necessity to form a contact and an interconnect for stabilizing the potential of the p$^+$-type impurity layer 11, so that the area per pixel can be shrunk.

In the example described above, the interconnects 28a and 28b are made of metal such as aluminum, but they may be made of metal mainly composed of copper or silver. In this case, the interconnects 28a and 28b are buried in the upper portion of the first interlayer insulating film 26 and the upper portion of the second interlayer insulating film 29, respectively. The contacts 27a and 27b may be made of metal such as tungsten or the like. However, in the case of using a copper interconnect, they may be made of copper integrally formed with the interconnect.

Even in the case where in the solid state imaging device of the first embodiment shown in FIG. 2, the conductivity types of all of the semiconductor layers constituting the pixel are reversed, the resulting photoelectric conversion element can be operated.

With the structure described above, the solid state imaging device according to the first embodiment can offer the following concrete effects. To be more specific, for the solid state imaging device of the first embodiment shown in FIG. 1, the amount of unnecessary charges generated in dark conditions, in terms of the number of white spots, is reduced to 50% or lower of that in the case where the p$^+$-type impurity layer 11 covering the upper and side surfaces of the charge storage layer 15 is not provided. Then, when the semiconductor epitaxial layer 10 is formed of silicon germanium with a uniform germanium content of about 20%, the sensitivity of the solid state imaging device of the first embodiment to light of a wavelength of, for example, 800 nm increases by about 10% or more as compared with the solid state imaging device with no p$^+$-type impurity layer 11.

Figure 3:
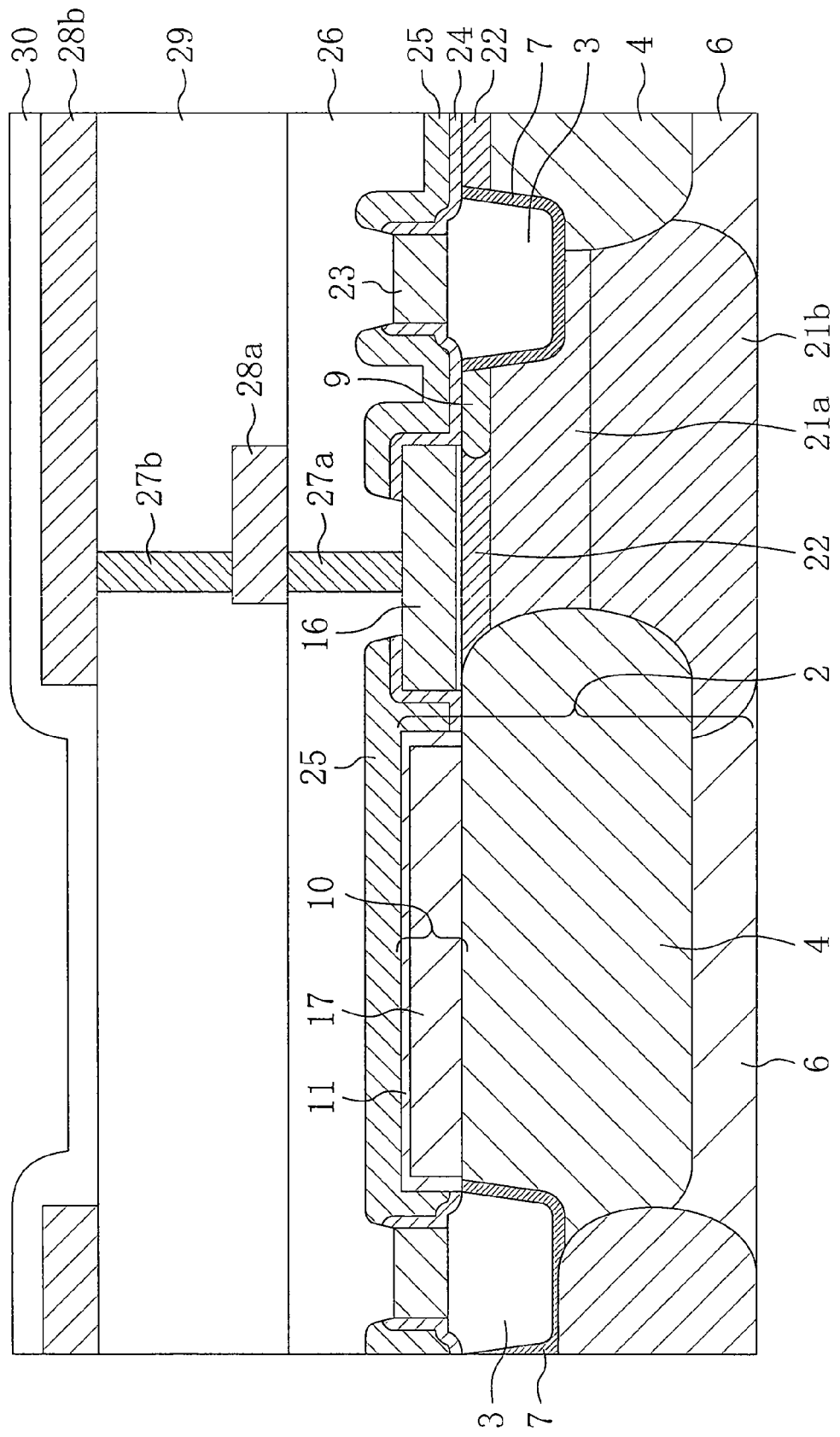
FIG. 3 is a sectional view showing a portion of a pixel in a first modification of the solid state imaging device of the first embodiment.

In the example shown in FIG. 2, the semiconductor epitaxial layer 10 is composed of the n-type charge storage layer 15 and the p$^+$-type impurity layer 11. Alternatively, as shown in FIG. 3, the semiconductor epitaxial layer 10 may be composed of the p$^+$-type impurity layer 11 and a p$^-$-type photoelectric conversion region 17 of silicon germanium containing p-type impurities. FIG. 3 is a sectional view showing a portion of a pixel in a first modification of the solid state imaging device of the first embodiment.

Referring to FIG. 3, in the semiconductor epitaxial layer 10, the p$^+$-type impurity layer 11 provided in the surface layer portions of the upper and side surfaces thereof has an impurity concentration of about $1\times10^{13}$ to $1\times10^{18}$ (counts/cm$^3$), and the p$^-$-type photoelectric conversion region 17 provided other than the surface layer portion of the semiconductor epitaxial layer 10 has an impurity concentration of about $1\times10^{14}$ to $1\times10^{17}$ (counts/cm$^3$). With this structure, the junction between the n-type semiconductor layer 4 and the p$^-$-type photoelectric conversion region 17 produces a depletion layer, and then charges generated by photoelectric conversion in the p$^-$-type photoelectric conversion region 17 are stored in the n-type semiconductor layer 4. Thereby, the voltage applied to the gate electrode 16 in transferring charges to the floating diffusion unit 9 can be lowered.

Concrete properties of the solid state imaging device of the first modification shown in FIG. 3 are measured. The result is that the number of white spots and the sensitivity are almost equal to those of the solid state imaging device shown in FIG. 1 and however the voltage applied to the gate electrode 16 in transferring charges in the photoelectric conversion element 2 to the FD unit 9 can be lowered to 90% or less of the voltage required for the conventional solid state imaging device.

Figure 4:
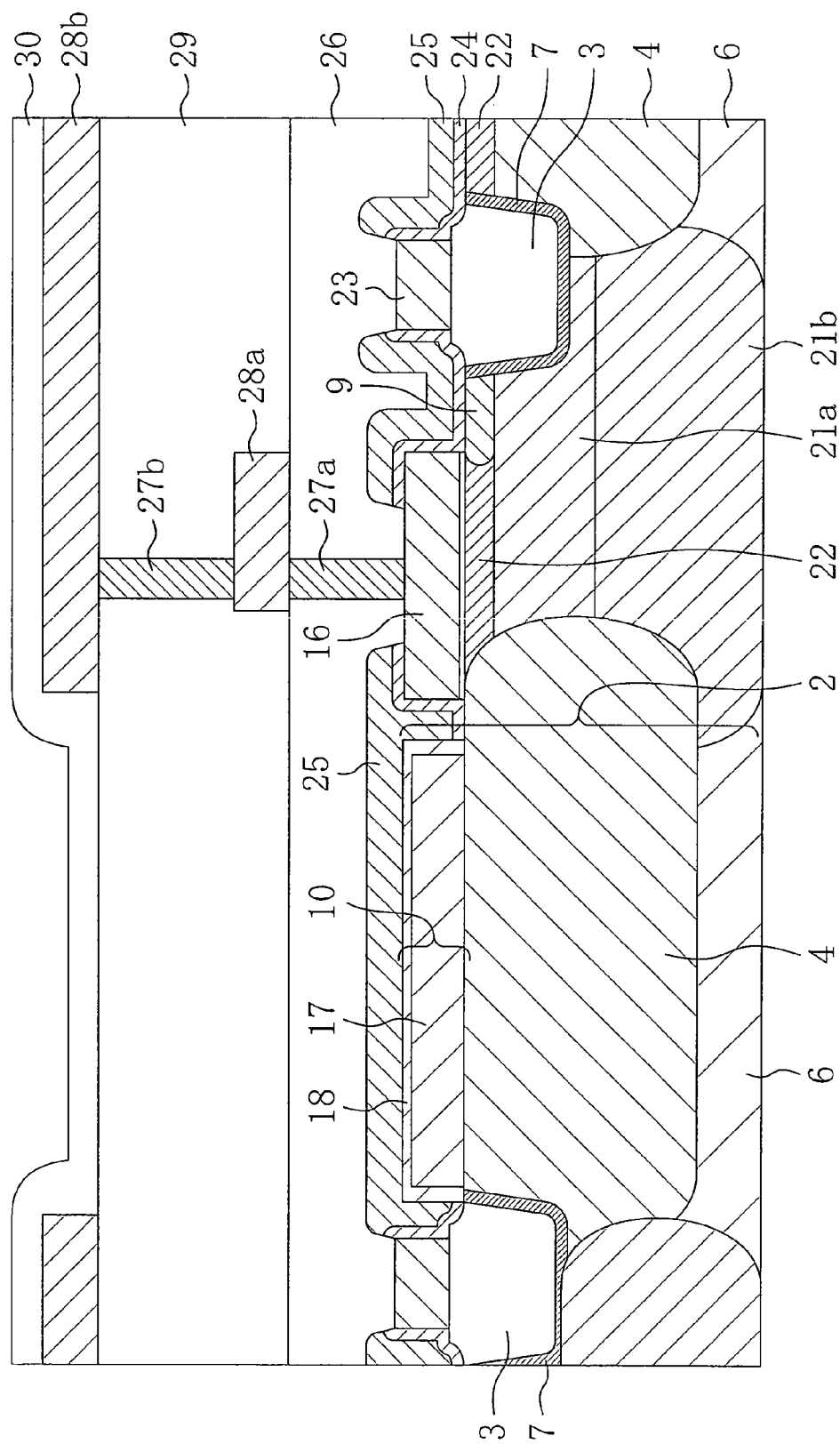
FIG. 4 is a sectional view showing a portion of a pixel in a second modification of the solid state imaging device of the first embodiment.

FIG. 4 is a sectional view showing a portion of a pixel in a second modification of the solid state imaging device of the first embodiment. In the solid state imaging device of the second modification shown in this figure, a buried layer 18 of p-type silicon covering the upper and side surfaces of the p$^-$-type photoelectric conversion region 17 is provided as a substitute for the p$^+$-type impurity layer 11 of the semiconductor epitaxial layer 10 shown in FIG. 3. The other components are identical to those of the solid state imaging device in FIG. 3 according to the first modification. Also in the solid state imaging device in FIG. 2 according to the first embodiment, this buried layer 18 may be provided as a substitute for the p$^+$-type impurity layer 11.

The thickness of the buried layer 18 is preferably about 1 to 100 nm. By providing the buried layer 18 containing p-type impurities, charges generated in the surface layer portion of the semiconductor epitaxial layer 10 can be reduced. Moreover, by making the impurity concentration of the buried layer 18 higher than that of the p$^-$-type photoelectric conversion region 17, a depletion layer can be prevented from expanding to the surface layer portion of the semiconductor epitaxial layer 10 and also the influence of charges generated in the surface of the buried layer 18 in dark conditions can be reduced. The impurity concentration of the buried layer 18 is set at about $1\times10^{15}$ to $1\times10^{18}$ (counts/cm$^3$). The p-type impurity concentration of the p$^-$-type photoelectric conversion region 17 is about $1\times10^{14}$ to $1\times10^{17}$ (counts/cm$^3$).

The buried layer 18 is constructed to be electrically connected to the p$^+$-type sidewall layer 7, whereby the potential thereof is stabilized. This construction eliminates the necessity to form a contact and an interconnect for stabilizing the potential of the buried layer 18, so that the area per pixel can be shrunk.

The properties of the solid state imaging device of the second modification shown in FIG. 4 are measured. The result is that by employing, for the surface layer portion of the semiconductor epitaxial layer 10, p-type silicon which has a wider band gap than silicon germanium and which can be formed by epitaxial growth, the number of white spots is decreased to 30% or less of that of the solid state imaging device with no buried layer 18. As incident light has a longer wavelength above 800 nm, the absorption coefficient of the p$^-$-type photoelectric conversion region 17 made of silicon germanium becomes higher than silicon by double digits or more. Thus, the device can provide especially high sensitivity.

Next, a fabrication method of the solid state imaging device of the first embodiment shown in FIG. 2 will be described with reference to the accompanying drawings. FIGS. 5A to 5D and 6A to 6C are sectional views showing fabrication process steps of the solid state imaging device according to the first embodiment.

Figure 5A:
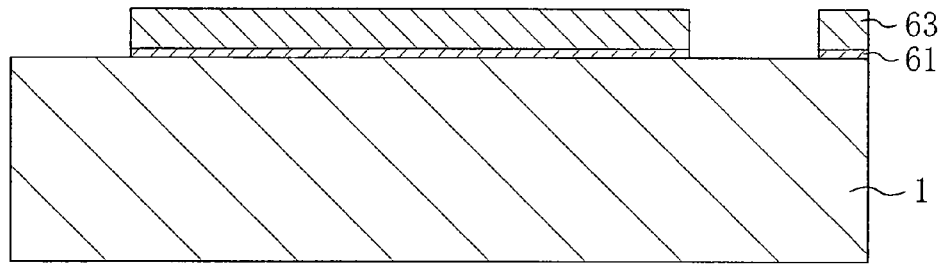
FIGS. 5A to 5D are sectional views showing fabrication process steps of the solid state imaging device according to the first embodiment.

Referring to FIG. 5A, first, a pad insulating film 61 of a silicon oxide film having a thickness of about 1 to 50 nm inclusive and an oxidation resistant film 63 of silicon nitride or the like having a thickness of 50 to 400 nm inclusive are sequentially formed on the semiconductor substrate 1 made of silicon or the like. Then, a photoresist (not shown) having an opening in a predetermined region is formed over the pad insulating film 61 and the oxidation resistant film 63. By etching using the photoresist as a mask, the pad insulating film 61 and the oxidation resistant film 63 are selectively removed to form an opening for exposing the predetermined region of the upper surface of the semiconductor substrate 1, and then the photoresist is removed. In this step, the photoresist may be left without removal. In the method of the first embodiment, silicon nitride is used as the material for the oxidation resistant film 63 serving as a hard mask, but silicon oxide may be used instead. A photoresist film may be used instead of the oxidation resistant film 63.

Figure 5B:
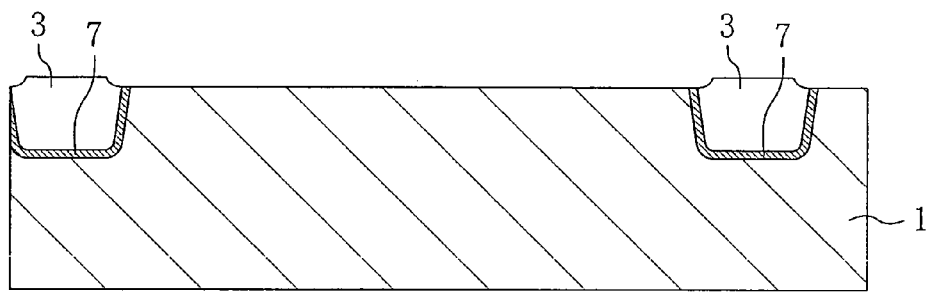

Next, as shown in FIG. 5B, by a dry etching method using the oxidation resistant film 63 as a mask, the semiconductor substrate 1 is formed with a groove, and then ion implantation is performed to form the p$^+$-type sidewall layer 7. An insulating film is deposited over the entire surface of the substrate including the groove. A portion of the insulating film formed on the oxidation resistant film 63 is removed, and then the oxidation resistant film 63 is removed by etching. In the manner described above, the isolation region 3 with a typical STI structure is formed.

Figure 5C:
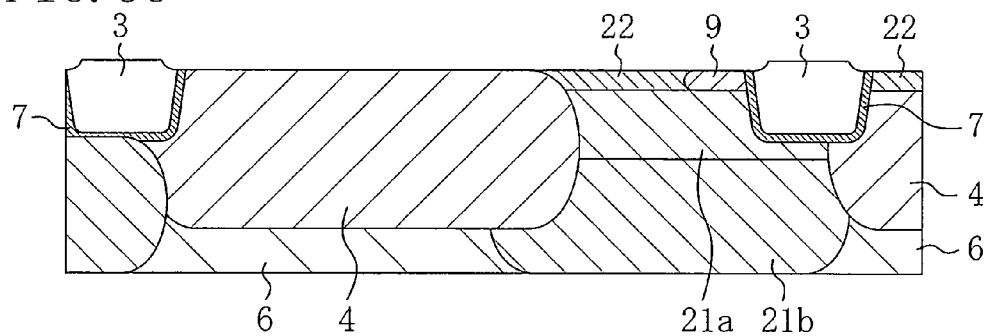

Subsequently, as shown in FIG. 5C, a photoresist having an opening in a predetermined region is formed by a lithography method. Using this photoresist as appropriate, the n-type semiconductor layer 4, the p$^-$-type semiconductor layer 6, the p-type stopper layers 21a and 21b, the p-type surface layer 22, and the FD unit 9 containing n-type impurities are formed in the semiconductor substrate 1 by an ion implantation method. After these ion implantations, the photoresist is removed.

Figure 5D:
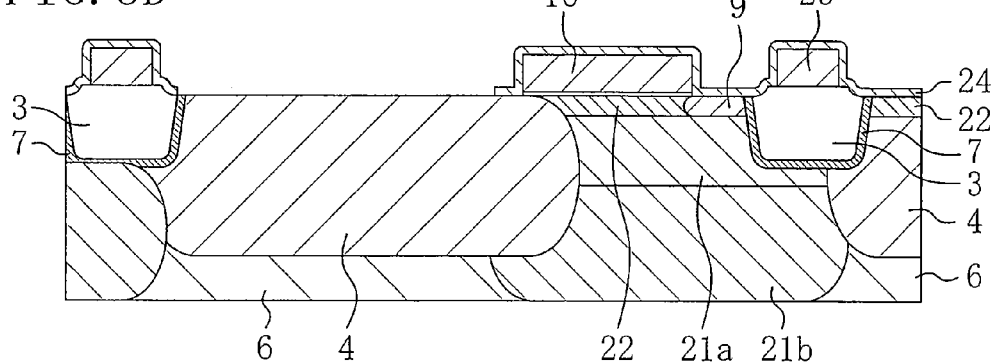

As shown in FIG. 5D, the gate interconnect 23 and the gate electrode 16 for transferring, to the FD unit 9, charges generated by photoelectric conversion are formed. Then, by a lithography method and an etching method, the silicon oxide film 24 with a thickness of about 1000 nm having an opening above the n-type semiconductor layer 4 is formed over the substrate.

Figure 6A:
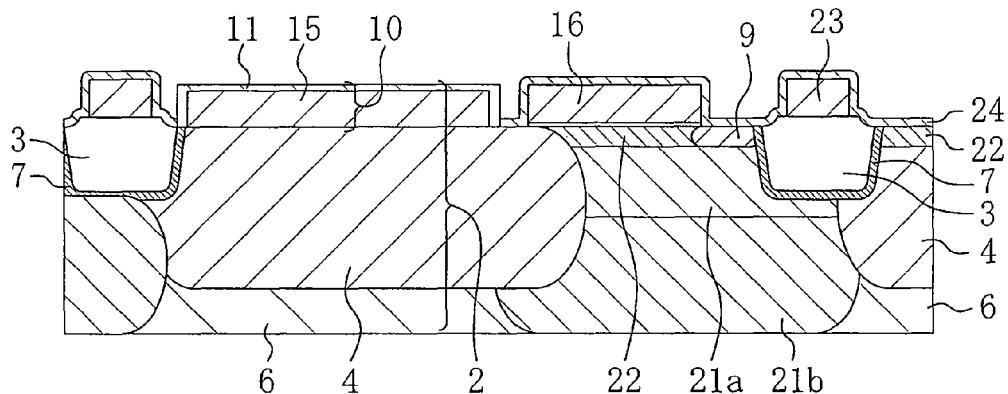
FIGS. 6A to 6C are sectional views showing fabrication process steps of the solid state imaging device according to the first embodiment.

Next, as shown in FIG. 6A, by a CVD method or the like, silicon germanium is epitaxially grown on the n-type semiconductor layer 4 located in the opening of the silicon oxide film 24, thereby forming the semiconductor epitaxial layer 10 with a thickness of 50 to 1000 nm. If the grown silicon germanium film is thickened to expand onto the silicon oxide film 24, a portion thereof serving as the semiconductor epitaxial layer 10 is covered with a photoresist by a lithography method and the other portion thereof is removed by a dry etching method with the silicon oxide film 24 used as a stopper layer. In the CVD method used in this step, with the substrate temperature heated at about 400 to 700° C. inclusive, the semiconductor epitaxial layer 10 is grown by mixing $Si_2H_6$ gas and $GeH_4$ to provide a desired composition. For example, it is sufficient that if the germanium content is 25%, the material gas is supplied into the apparatus to meet the equation: $Si_2H_6/GeH_4$=about 0.29. In the case where the buried layer 18 made of p-type silicon is formed on the surface layer portion of the semiconductor epitaxial layer 10, it is sufficient that no $GeH_4$ gas is supplied into a reaction chamber of the CVD apparatus. In order to form the semiconductor epitaxial layer 10 to have the p-type conductivity, $B_2H_6$ gas is mixed during the growth thereof. In order to form the n-type charge storage layer 15 in the semiconductor epitaxial layer 10, it is sufficient to mix $PH_3$ gas during the growth thereof. In order to form the surface layer portions of the upper and side surfaces of the semiconductor epitaxial layer 10 to have the p$^+$-type conductivity, the surface layer portion of the semiconductor epitaxial layer 10 is grown on the condition that the flow rate of $B_2H_6$ gas is increased and the material gas for B (boron) is contained at a high concentration. In the manner described above, the semiconductor epitaxial layer 10 is formed on the n-type semiconductor layer 4. Accordingly, by the CVD method carried out on the above-mentioned conditions, the structures shown in FIGS. 2, 3, and 4 are formed.

Figure 6B:
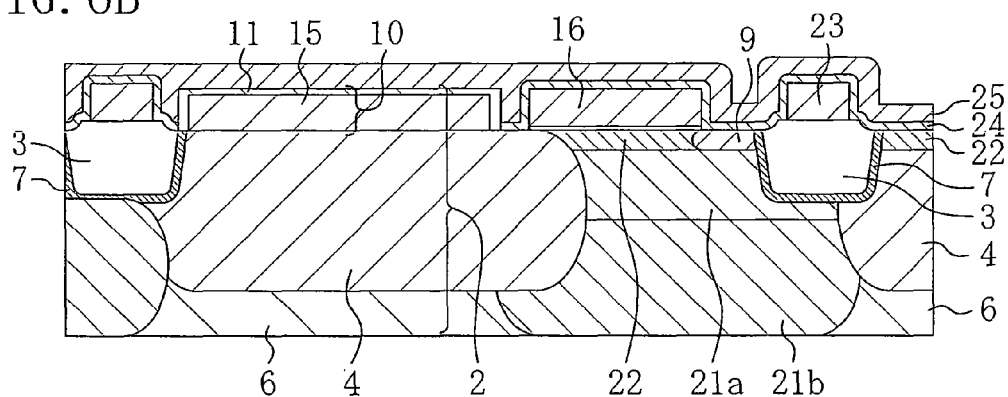

Subsequently, as shown in FIG. 6B, the entire upper surface of the substrate including the semiconductor epitaxial layer 10 is covered with the silicon oxide film 25 to prevent diffusion of germanium into a transistor portion or a peripheral circuit.

Figure 6C:
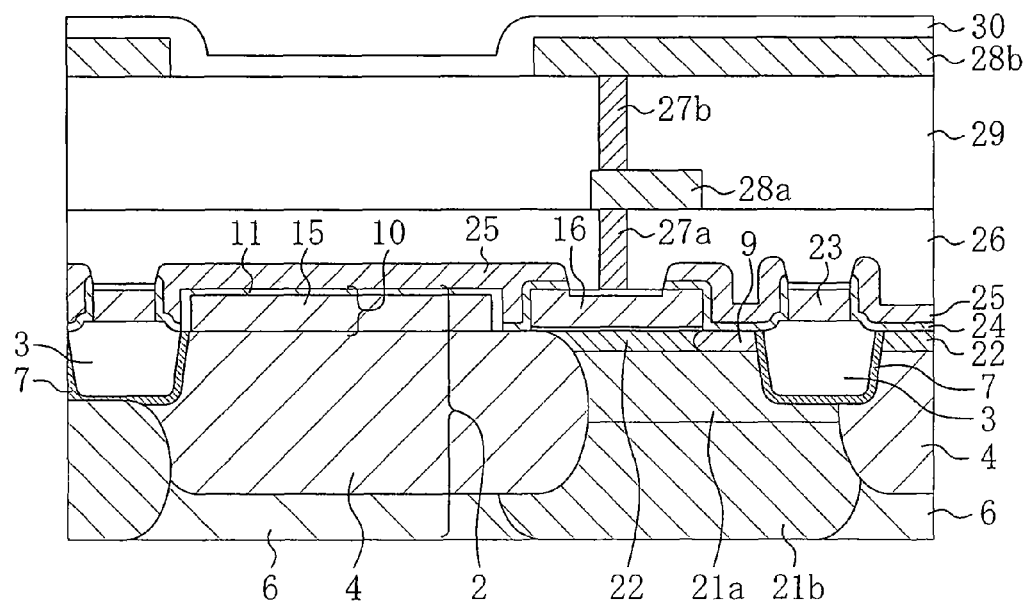

As shown in FIG. 6C, the first interlayer insulating film 26 is formed by a CVD method or the like, and then planarization is performed by a CMP (Chemical Mechanical Polishing) method. Thereafter, patterning is performed by a lithography method and a contact hole is formed by a dry etching method. By a known method, the formed contact hole is filled with metal such as tungsten or the like to form the contact 27a, and then the upper surface of the contact 27a is planarized by a CMP method. A metal film made of aluminum or the like is formed on the interlayer insulating film 26, and then the formed metal film is patterned by a lithography method and a dry etching method to form the interconnect 28a. Subsequently to this, if the number of interconnect layers is intended to increase, the same procedure as described above is performed to additionally form an interlayer insulating film, a contact, and an interconnect. Finally, a pad region (not shown) made of a conductor of metal or the like is formed by a lithography method and a dry etching method. In the manner described above, the solid state imaging device according to the first embodiment is fabricated.

In the case where the interconnects 28a and 28b are copper interconnects, the contacts 27a and 27b and the interconnects 28a and 28b can be formed by a typical damascene or dual-damascene process.

Second Embodiment

A solid state imaging device according to a second embodiment of the present invention will be described with reference to the accompanying drawings.

Figure 7:
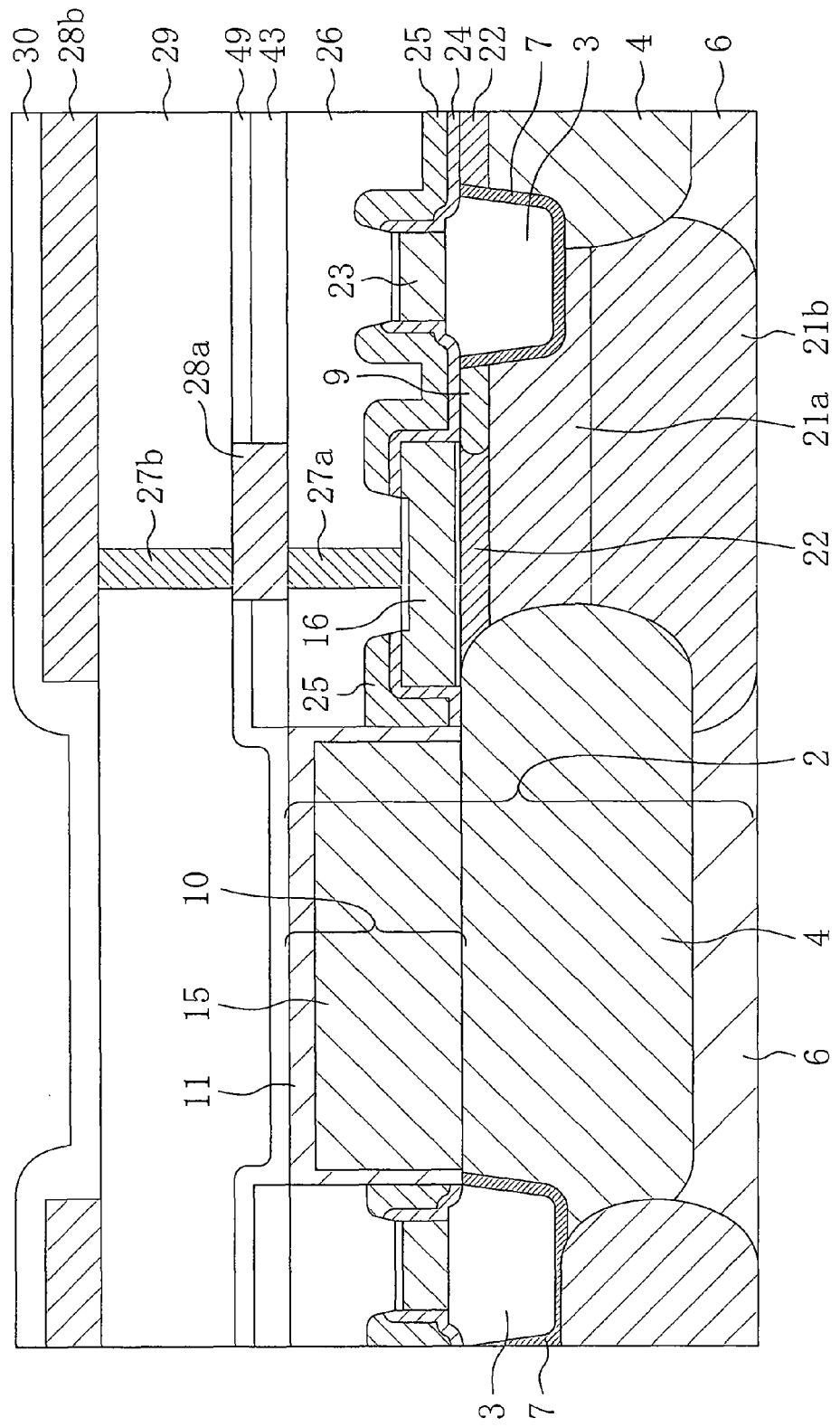
FIG. 7 is a sectional view showing a portion of a pixel of a solid state imaging device according to a second embodiment of the present invention.
Figure 8A:
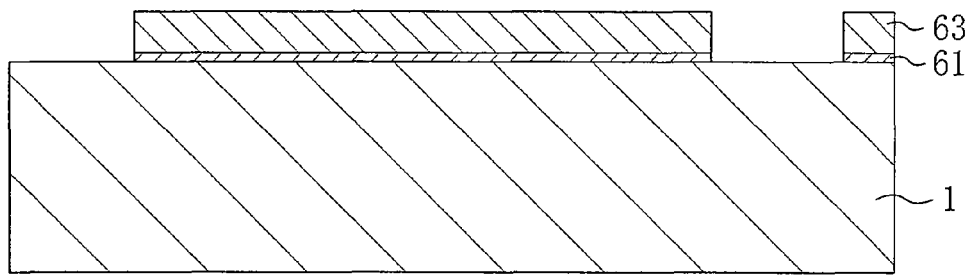
FIGS. 8A to 8D are sectional views showing fabrication process steps of the solid state imaging device according to the second embodiment.
Figure 8B:
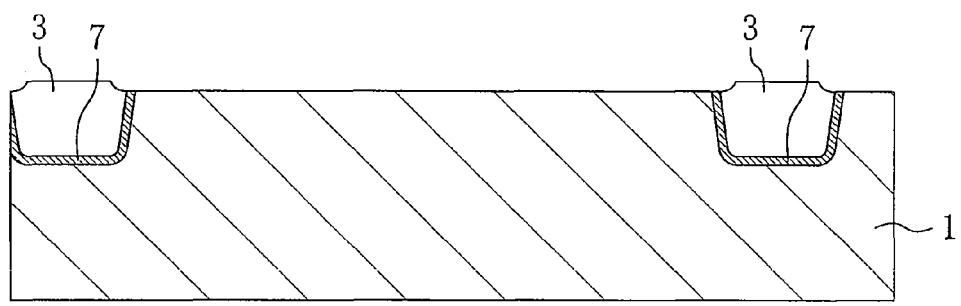
Figure 8C:
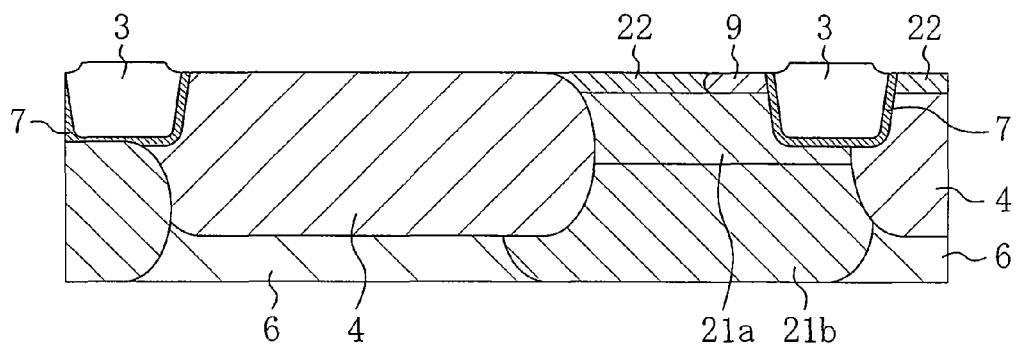
Figure 8D:
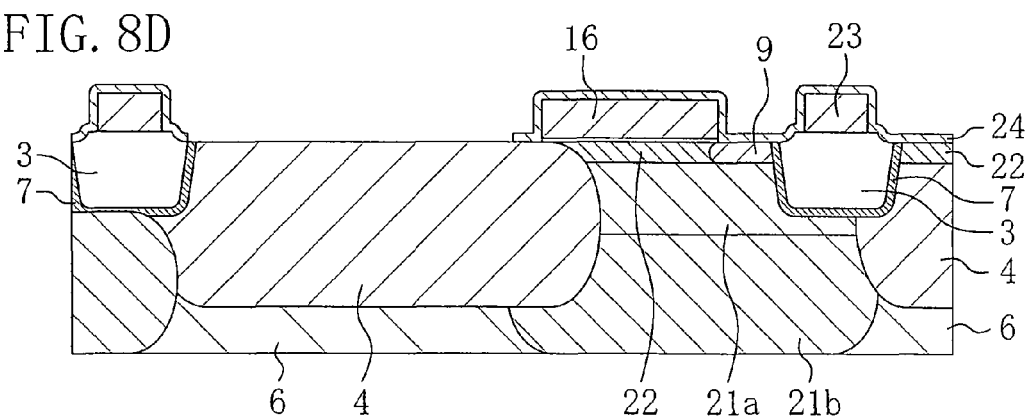

FIG. 7 is a sectional view showing a portion of a pixel of the solid state imaging device according to the second embodiment of the present invention. FIG. 7 illustrates a cross section taken along the line crossing the photoelectric conversion element 2, the gate electrode 16 of the transfer transistor, and the FD unit 9. The solid state imaging device according to the second embodiment is characterized in that in the photoelectric conversion element 2, the charge storage layer 15 has a great thickness and the upper surface of the semiconductor epitaxial layer 10 (the upper surface of the p$^+$-type impurity layer 11) is located at a level equal to or lower than the level of the upper surface of the contact 27a and equal to or higher than the level of the upper surface of the gate electrode 16. Associated with this, a silicon oxide film 43 and a silicon oxide film 49 are formed between the first interlayer insulating film 26 and the second interlayer insulating film 29. In the solid state imaging device according to the second embodiment, the other components are identical to those of the solid state imaging device according to the first embodiment. Hence, their description will be omitted or simplified.

Also in the solid state imaging device according to the second embodiment, the surface layer portion of the semiconductor epitaxial layer 10 is formed of the p$^+$-type impurity layer 11. That is to say, the p$^+$-type impurity layer 11 covers the upper and side surfaces of the n-type charge storage layer 15. The structure in which the semiconductor epitaxial layer 10 penetrating the first interlayer insulating film 26 is thickened is also applicable to the solid state imaging devices of the first and second modifications of the first embodiment shown in FIGS. 3 and 4, respectively, which are constructed so that the entire semiconductor epitaxial layer 10 is made of a p-type semiconductor.

With this construction, the optical path of incident light elongates in the light absorption region, and thereby the amount of charge generation to be subjected to photoelectric conversion increases to enhance the sensitivity of the photoelectric conversion element 2.

In the case where the interconnect 28a is made of metal with a relatively low melting point, such as Al, if the semiconductor epitaxial layer 10 is grown to the same level as the interconnect 28a, the substrate temperature during the growth becomes about 400° C. This raises the possibility of melting of the interconnect 28a. To avoid this possibility, the upper surface of the semiconductor epitaxial layer 10 is set to have a level equal to or lower than the level of the upper surface of the contact 27a, which prevents the occurrence of troubles such as connection failure of an interconnect.

However, the materials for the interconnects 28a and 28b may be copper, or metal or the like mainly containing copper. In this case, the interconnects 28a and 28b are buried in the upper portions of the first and second interlayer insulating films 26 and 29, respectively. Since copper has a melting point as high as 1084° C., the semiconductor epitaxial layer 10 can be grown after formation of the copper interconnect. Accordingly, if metal with a high melting point, such as copper, is used as an interconnect material, the upper surface of the semiconductor epitaxial layer 10 can be raised to a substantially equal level to the level of the upper surface of the interconnect 28a.

With the structure described above, the solid state imaging device according to the second embodiment can offer the following concrete effects. To be more specific, for the solid state imaging device according to the second embodiment, the amount of unnecessary charges generated in dark conditions, in terms of the number of white spots, is reduced to 50% or lower of that of the solid state imaging device having the photoelectric conversion element 2 whose surface layer portion of the semiconductor epitaxial layer 10 does not exhibit the p-type conductivity. Then, when use is made of the semiconductor epitaxial layer 10 with a germanium content of about 20%, the sensitivity of the photoelectric conversion element 2 to light of a wavelength of, for example, 800 nm increases by about 30% or more.

Next, a method for fabricating a solid state imaging device according to the second embodiment will be described with reference to the accompanying drawings. FIGS. 8A to 8D and 9A to 9C are sectional views showing fabrication process steps of the solid state imaging device according to the second embodiment.

First, referring to FIGS. 8A to 8D, in the same manner as the fabrication method of the first embodiment shown in FIGS. 5A to 5D, the isolation region 3, the p⁻-type semiconductor layer 6, the n-type semiconductor layer 4, the p-type stopper layers 21a and 21b, the p-type surface layer 22, and the FD unit 9 are formed in the semiconductor substrate 1.

Figure 9A:
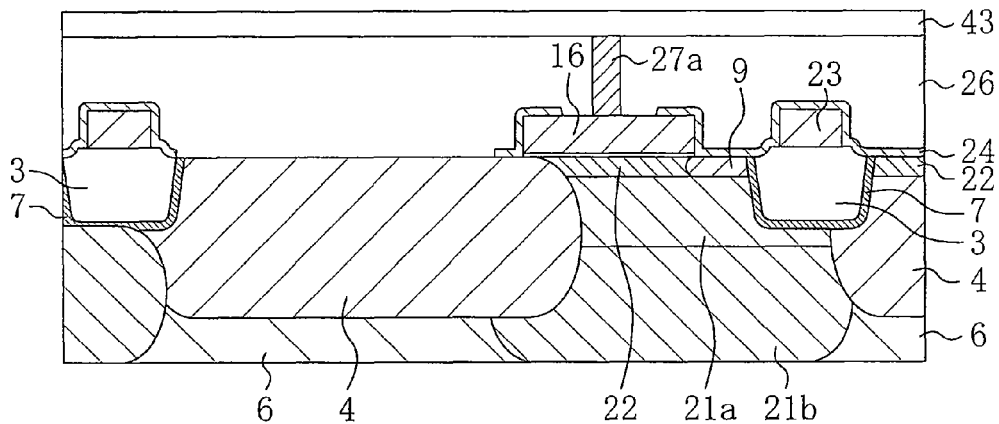
FIGS. 9A to 9C are sectional views showing fabrication process steps of the solid state imaging device according to the second embodiment.

Next, as shown in FIG. 9A, the gate electrode 16, the gate interconnect 23, and the silicon oxide film 24 are formed over the substrate in the same manner as the first embodiment, and then the first interlayer insulating film 26 is formed over the substrate. Part of the silicon oxide film 24 located on a portion of the gate electrode 16 is removed, and then the contact 27a is formed which penetrates the first interlayer insulating film 26 to make connection with the gate electrode 16. The contact 27a is made of metal such as tungsten or the like. Subsequently, the upper surface of the contact 27a is planarized by a CMP method, and then the silicon oxide film 43 with a thickness of about 300 nm is formed on the first interlayer insulating film 26 and the contact 27a. The reason why the silicon oxide film 43 is formed in this step is to protect the contact 27a during formation of the semiconductor epitaxial layer 10.

Figure 9B:
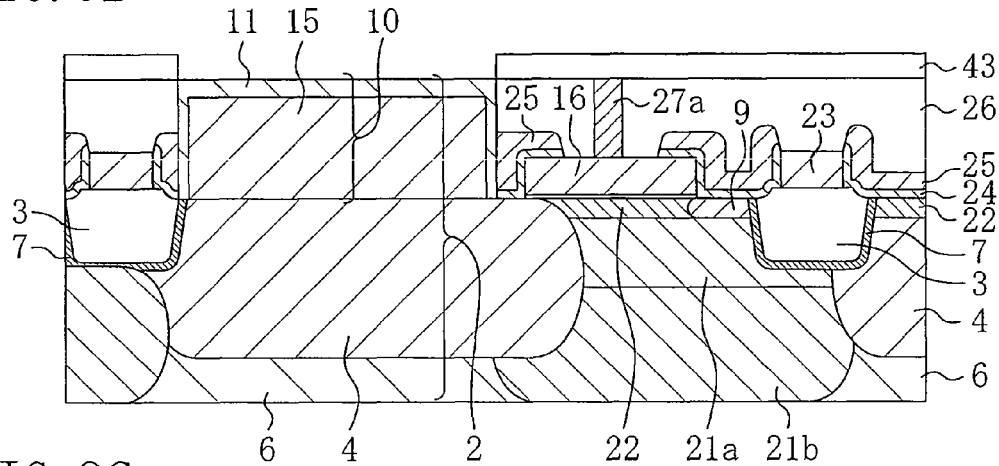

Subsequently, as shown in FIG. 9B, by a lithography method and a dry or wet etching method, portions of the first interlayer insulating film 26 and the silicon oxide film 43 located on or above the n-type semiconductor layer 4 are selectively removed to expose the upper surface of the n-type semiconductor layer 4. By a CVD method or the like as in the case of the step shown in FIG. 6A, the semiconductor epitaxial layer 10 of silicon germanium is formed on the n-type semiconductor layer 4. In the second embodiment, the semiconductor epitaxial layer 10 has a thickness of, for example, about 1 μm.

Figure 9C:
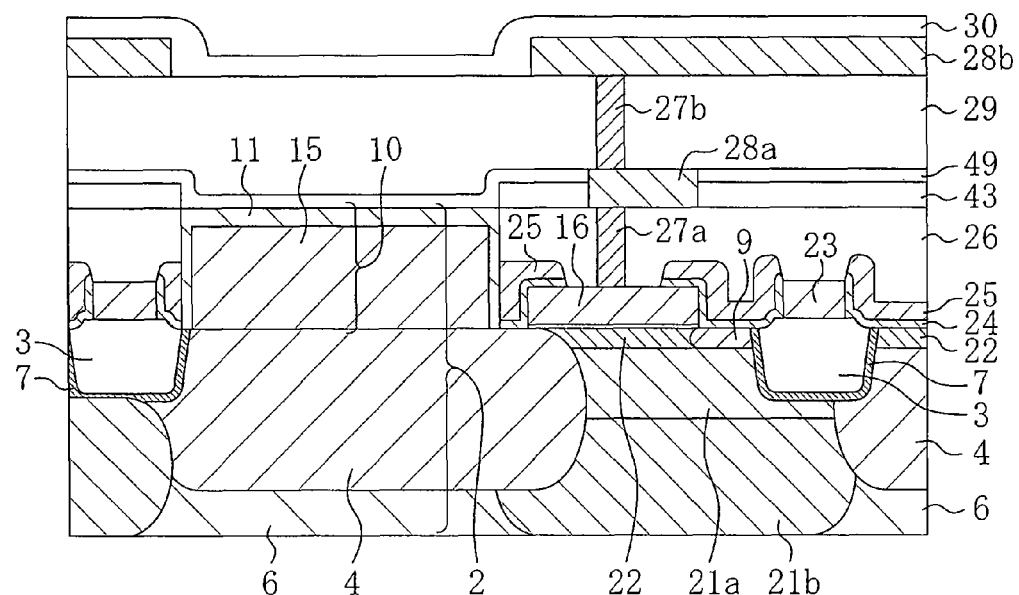
Figure 10:
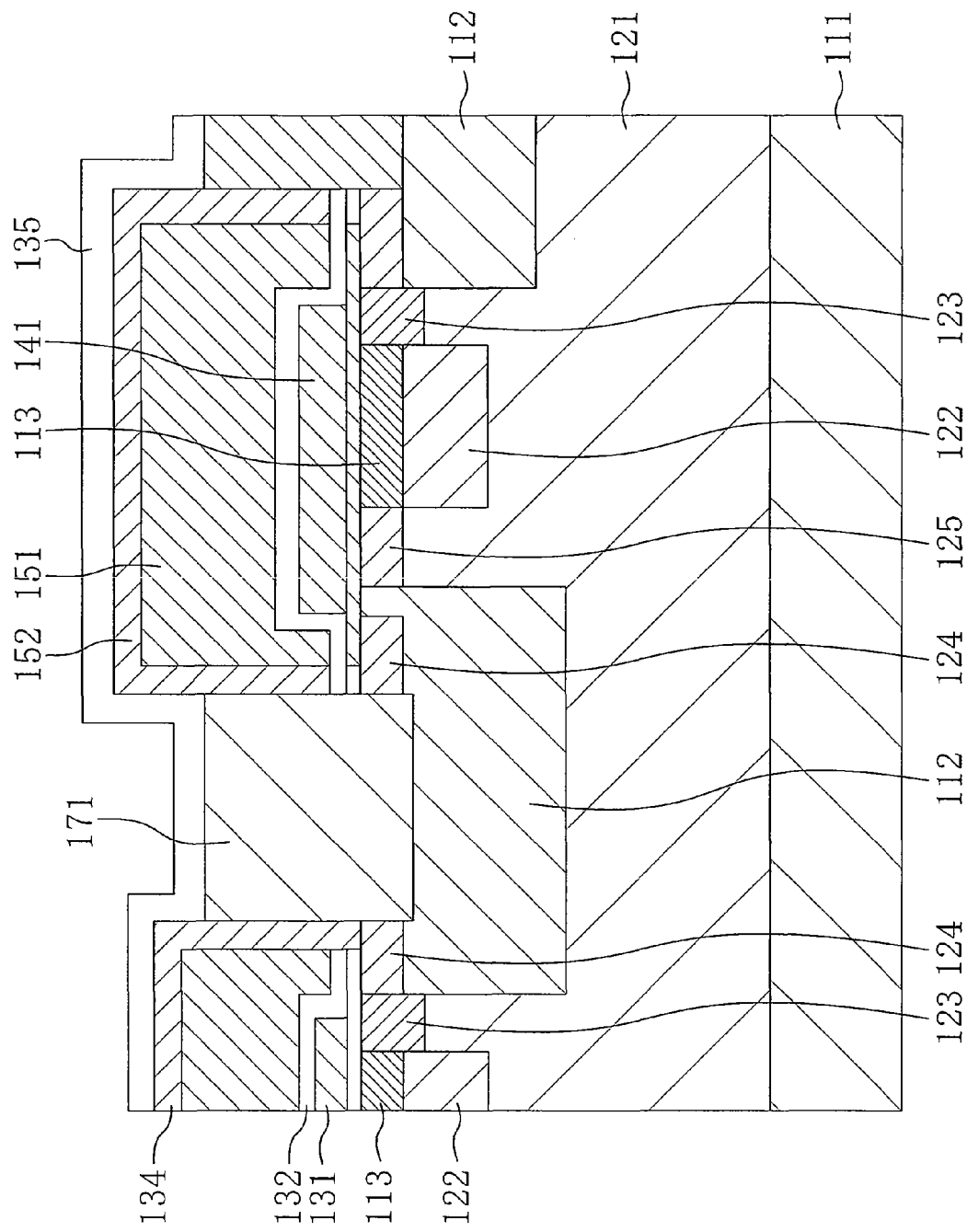
FIG. 10 is a sectional view showing a photodiode unit of a conventional solid state imaging device.

As shown in FIG. 9C, the entire substrate surface including the semiconductor epitaxial layer 10 is covered with the silicon oxide film 49, and then by a lithography method and dry etching, a groove is etched until the surface of the tungsten contact 27 appears, thereby exposing the upper surface of the contact 27a. A metal film of aluminum or the like is formed over the substrate, and then by a lithography method and a dry etching method, the formed metal film is patterned to form the interconnect 28a. Subsequently to this, if the number of interconnect layers is intended to increase, the same procedure as described above is performed to additionally form an interlayer insulating film, a contact, and an interconnect. Finally, a pad region (not shown) made of a conductor of metal or the like is formed by a lithography method and a dry etching method.

By forming, in the manner described above, the semiconductor epitaxial layer 10 with a greater thickness than that of the first embodiment, the sensitivity especially to light with a long wavelength such as red light can be greatly improved. Moreover, the solid state imaging device with a reduced dark current can be provided.

With the fabrication method of the second embodiment, the interconnect 28a is formed after formation of the semiconductor epitaxial layer 10. Therefore, even though the interconnect material used is metal with a low melting point such as aluminum, troubles such as interconnect breaks or connection failure can be eliminated.

The above-described solid state imaging device and its fabrication method according to the present invention are useful for imaging devices such as various types of digital cameras, cellular telephones, video cameras, monitoring cameras, and the like for taking images, and also for their fabrications.

What is claimed is:

1. A solid state imaging device, comprising a pixel having a photoelectric conversion element formed on a semiconductor substrate, wherein the photoelectric conversion element includes:

a first semiconductor layer of a first conductivity type formed on the semiconductor substrate;

a second semiconductor layer of a second conductivity type formed on the first semiconductor layer and forming a junction therebetween;

a third semiconductor layer formed on the second semiconductor layer and having a smaller band gap energy than the second semiconductor layer, the third semiconductor layer being made of a single-crystal semiconductor and containing an impurity;

a fourth semiconductor layer of the first conductivity type covering a side surface of the third semiconductor layer and an upper surface of the third semiconductor layer; and an isolation region covered with a sidewall semiconductor layer of the first conductivity type adjoining to the second semiconductor layer, wherein a lower surface of a side layer of the fourth semiconductor layer is directly connected to a top surface of a side layer of the sidewall semiconductor layer.

2. The device of claim 1, wherein the first and second semiconductor layers are made of silicon, respectively, and
the third semiconductor layer is made of SixGe(1−x), when x meets 0≦x<1.

3. The device of claim 1,
wherein the fourth semiconductor layer is made of a semiconductor having the same composition as the third semiconductor layer.

4. The device of claim 1,
wherein the third semiconductor layer is made of a semiconductor of the second conductivity type.

5. The device of claim 1,
wherein the third semiconductor layer is made of a semiconductor of the first conductivity type.

6. The device of claim 1,
wherein the fourth semiconductor layer is made of silicon.

7. The device of claim 2,
wherein the germanium content in the third semiconductor layer increases upwardly from the interface with the second semiconductor layer.

8. The device of claim 2,
wherein the germanium content in the third semiconductor layer decreases upwardly from the interface with the second semiconductor layer.

9. The device of claim 1, further comprising:
a fifth semiconductor layer of the first conductivity type formed adjacent to the second semiconductor layer;
a transfer transistor having a gate electrode formed on the fifth semiconductor layer and transferring charges generated in the photoelectric conversion element;
an interlayer insulating film formed on the transfer transistor;
an interconnect formed on or in an upper portion of the interlayer insulating film and electrically connected to the gate electrode; and
a contact penetrating the interlayer insulating film and connecting the gate electrode and the interconnect,
wherein the upper surface of the fourth semiconductor layer is located at a level lower than at least the level of an upper surface of the interconnect.

10. The device of claim 9,
wherein the interconnect is formed on the interlayer insulating film, and
the upper surface of the fourth semiconductor layer is located at a level equal to or lower than the level of the upper surface of the gate electrode.

11. The device of claim 9,
wherein the interconnect is formed on the interlayer insulating film, and
the upper surface of the fourth semiconductor layer is located at a level higher than the level of the upper surface of the gate electrode and equal to or lower than the level of the upper surface of the contact.

12. The device of claim 9,
wherein the interconnect is buried in the upper portion of the interlayer insulating film, and
the upper surface of the fourth semiconductor layer is located at a level higher than the level of the upper surface of the gate electrode and equal to or lower than the level of the upper surface of the interconnect.

13. The device of claim 9, further comprising a floating diffusion which is opposed to the photoelectric conversion element with the fifth semiconductor layer interposed therebetween and which has charges transferred through the transfer transistor, the charges being generated in the photoelectric conversion element,
wherein the second semiconductor layer is surrounded by a semiconductor layer of the first conductivity type.

14. The device of claim 1,
wherein the first semiconductor layer is made of a p-type semiconductor, and the second semiconductor layer is made of an n-type semiconductor.

15. The device of claim 1, wherein said side surface of the third semiconductor layer and said upper surface of the third semiconductor layer are substantially perpendicular to one another.

16. The device of claim 1, wherein a lower surface of another side layer of the fourth semiconductor layer is directly connected to a top surface of the second semiconductor layer.

17. The device of claim 1, wherein a lower surface of a lower layer of the sidewall semiconductor layer is disposed above a lower surface of the second semiconductor layer.

18. The device of claim 1, wherein a lower surface of another semiconductor layer is disposed below a lower surface of the second semiconductor layer.

* * * * *